United States Patent [19]

Wei

[11] 4,349,394

[45] Sep. 14, 1982

[54] METHOD OF MAKING A ZENER DIODE UTILIZING GAS-PHASE EPITAXIAL DEPOSITION

[75] Inventor: Lawrence S. Wei, Scottsdale, Ariz.

[73] Assignee: Siemens Corporation, Iselin, N.J.

[21] Appl. No.: 206,385

[22] Filed: Nov. 13, 1980

Related U.S. Application Data

[63] Continuation-in-part of Ser. No. 100,970, Dec. 6, 1979, abandoned.

[51] Int. Cl.$^3$ .............................................. H01L 21/205
[52] U.S. Cl. ........................................ 148/175; 29/578; 29/589; 357/13; 357/14; 357/89
[58] Field of Search ................ 148/175; 29/578, 589; 357/13, 14, 89

[56] References Cited

U.S. PATENT DOCUMENTS

| | | | |
|---|---|---|---|
| 3,488,235 | 1/1970 | Walczak et al. ................ | 148/175 |
| 3,501,336 | 3/1970 | Dyer et al. ..................... | 148/175 |
| 3,509,428 | 4/1970 | Mankarious et al. .......... | 357/48 |
| 3,544,863 | 12/1970 | Price et al. ..................... | 357/48 |
| 3,579,278 | 5/1971 | Heer ............................... | 357/13 |
| 3,602,778 | 8/1971 | Ura et al. ....................... | 357/13 |
| 3,653,991 | 4/1972 | Sirtl et al. ...................... | 357/48 |
| 3,663,319 | 5/1972 | Rose .............................. | 148/175 |
| 3,701,696 | 10/1972 | Mets ............................... | 148/175 |
| 3,723,832 | 3/1973 | Bachmeier ..................... | 357/13 |
| 3,776,788 | 12/1973 | Henker ........................... | 156/628 |
| 3,953,254 | 4/1976 | Valdman ........................ | 148/175 |
| 4,053,335 | 10/1977 | Hu .................................. | 148/174 |

OTHER PUBLICATIONS

Ishii et al. "Silicon Epitaxial Wafer with Abrupt Interface by Two-Step Epitaxial Growth Technique" J. Electrochem. Soc., vol. 122, No. 11, Nov. 1975, pp. 1523-1531.

Maeda et al. "Effect of Vapor Etching on 'Diffuse-Up' of Buried Impurities into Epitaxial Layer", Japan J. Appl. Physics, vol. 13, 1974, No. 1, pp. 1903-1904.

Barson et al., "Gettering Technique" I.B.M. Tech. Discl. Bulletin, vol. 15, No. 6, Nov. 1972, p. 1752.

*Primary Examiner*—L. Dewayne Rutledge
*Assistant Examiner*—W. G. Saba
*Attorney, Agent, or Firm*—Spellman, Joel and Pelton

[57] ABSTRACT

A method of making a Zener diode having a Zener voltage in the range of 2.4-3.3 volts. The PN junction is preferably formed by selective epitaxial deposition of P-type silicon on a previously oxidized N-type silicon wafer in an opened region where the oxide has been etched away. The N-type wafer may be a uniform silicon wafer with resistivity in the range of 0.004 to 0.006 Ω-cm or a low resistivity N-type wafer having a 5-20 μm thick N-type silicon epitaxial layer with a resistivity in a range of 0.004-0.006 Ω-cm. The selectively deposited P-type layer may have a resistivity of 0.001-0.003 Ω-cm and a thickness of 1.5-3.0 μm. The P-type layer is grown in a gas phase epitaxial reactor by etching the N-type wafer at a first temperature and then depositing heavily-doped silicon at a second, lower temperature.

40 Claims, 10 Drawing Figures

METHOD OF MAKING A ZENER DIODE UTILIZING GAS-PHASE EPITAXIAL DEPOSITION

CROSS-REFERENCE TO RELATED APPLICATION

This application is a continuation-in-part of application Ser. No. 100,970, filed Dec. 6, 1979, now abandoned.

BACKGROUND OF THE INVENTION

The present invention relates to a method of making very low voltage Zener diodes—that is, Zener diodes in a range of 2.4–3.3 V at 5 mA—using epitaxial deposition.

Alloying methods have previously been used to obtain PN junctions with breakdown voltages below 3.3 V. As commonly known, alloyed junctions are not uniform and Zener diodes formed by such methods have tendencies to breakdown at the surface. To overcome surface breakdown problems, a diffused junction has to be formed prior to the formation of the alloyed junction to serve as a guard ring. The provision of a diffused junction involves an extra step of processing.

It is also known to form PN junctions for Zener diodes by diffusion. This technique is disclosed, for example, in the U.S. Pat. No. 3,723,832 to Bachmeier. However, it is not possible by diffusion to obtain an abrupt PN junction which is necessary for low breakdown voltages.

Selective epitaxial deposition has been used to create PN junctions yielding Zener voltages which are lower than the voltages obtainable by diffusion. However, conventional epitaxial deposition techniques still do not yield Zener diodes with very low Zener voltages; for example, Zener diodes in the range of 2.4–3.3 V at 5 mA.

SUMMARY OF THE INVENTION

An object of the present invention is to provide a method for making very low voltage Zener diodes with good electrical characteristics.

A further object of the present invention is to provide a method for making very low voltage Zener diodes which is relatively simple and inexpensive to carry out.

These objects, as well as other objects which will become apparent in the discussion that follows, are achieved by forming the PN junction by epitaxial deposition of either N or P-type silicon on a previously oxidized silicon wafer of opposite conductivity type. The wafer may be a uniform silicon wafer with a resistivity in the range of 0.004 to 0.006 Ω-cm or a low resistivity wafer having a 5-20 μm thick silicon epitaxial layer with a resistivity in the range of 0.004–0.006 Ω-cm. The deposited N or P-type layer may have a resistivity of 0.001–0.003 Ω-cm and a thickness of 1.5–3.0 μm. This layer is grown in a gas phase epitaxial reactor by etching the wafer at a first temperature and then depositing heavily doped silicon at a second, lower temperature.

I have found that very low breakdown voltages in the range of 2.4–3.3 V may be achieved if the etching takes place at a first temperature in the range of 1100°–1150° C. and the epitaxial deposition is effected at a second, lower temperature in the range of 980°–1000° C.; that is, at least 100° C. lower than the first temperature. In particular, the lower second temperature is, the lower will be the Zener voltage. Other features and details of the invention may be derived from the following disclosure of an embodiment with reference to the various figures of the drawings.

DESCRIPTION OF THE PREFERRED EMBODIMENTS

Figure 1:
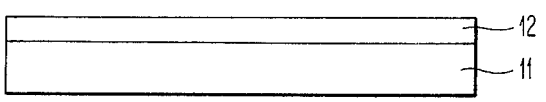
FIGS. 1–8 are sectional views of a semiconductor wafer structure illustrating successive stages of manufacture of a Zener diode according to a preferred embodiment of the present invention.

The preferred embodiments of the present invention will now be described with reference to FIGS. 1–10 of the drawings. In FIGS. 1–8 identical elements have been designated with the same reference numerals.

1. Starting wafers: The starting wafers are preferably N-type silicon wafers with the dopant material being phosphorus, arsenic or antimony. If P-type wafers are used, the dopant material is boron. The crystal orientation can be (100), (110) of 2° to 6° from (111), or any other crystal orientation suitable for epitaxial growth. The wafer thickness is typically 8 to 20 mils, but other suitable thicknesses may be used. The wafer resistivity preferably ranges from 0.004 to 0.006 Ω-cm depending upon the Zener voltage required. The selection of the appropriate substrate resistivity may be taken from the following table:

TABLE I

| Approximate Zener Voltage (v) | Approximate Substrate Resistivity (Ω-cm) |
|---|---|
| 3.3 | 0.0060 |
| 3.0 | 0.0055 |
| 2.7 | 0.0050 |
| 2.4 | 0.0045 |

Instead of using an N or P-type wafer with a uniform resistivity throughout, it is possible to deposit an N or P-type epitaxial layer, with the required resistivity for the Zener voltage per the Table above, on a substrate wafer. The substrate wafer may have any reasonably low resistivity, preferably less than 0.020 Ω-cm. In this latter embodiment, the Zener voltage will be determined by the resistivity of the epitaxial layer, and not the substrate resistivity.

The epitaxial layer preferably has a thickness in the range of 5–20 μm.

FIG. 1 shows a cross section of a silicon wafer 11, with a silicon epitaxial layer 12 of lower resistivity.

2. Oxidation: After preparation of the starting wafer, a thermal oxide layer is grown on the silicon surface. The method of growing oxide can be any standard appropriate oxidation method used in processing high quality single crystal silicon devices. The oxide, which forms an insulating layer, preferably has a thickness in the range of 0.5–1.5 μm. If the thickness of the oxide layer is too low, the insulation qualities will be impaired; if the thickness is too great, the oxidation will create stresses in the semiconductor structure by thermal mismatch.

Preferably, thermal oxidation is carried out in the temperature range of 1,000°–1,200° C.

Figure 2:
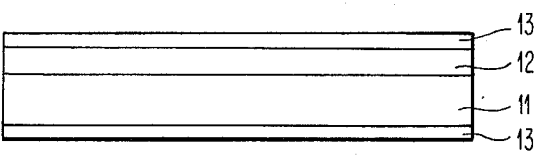

FIG. 2 shows a cross section of the starting wafer 11 and 12 after an oxide layer 13 has been grown on both sides.

3. Backgrind: The oxide on the back side of the wafer, together with portions of silicon, is removed by mechanical grinding, lapping or standard chemical removal. The amount of silicon to be removed is dictated by the final wafer thickness requirement, typically 8–10 mils.

Figure 3:
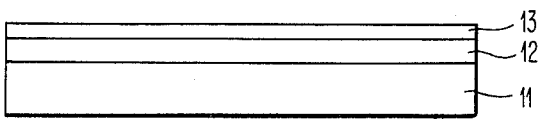

FIG. 3 shows a cross section of the wafer after the oxide and silicon removal step has been completed.

4. Gettering: A standard getter technique is used to remove undesirable inpurities and defects away from the oxide-silicon interface where the junction will subsequently be formed. This gettering process consists of doping very high concentrations of phosphorus on the backside silicon and frontside oxide. This process also provides a good low resistance layer on the backside of the wafer to facilitate good electrical contact.

Figure 4:
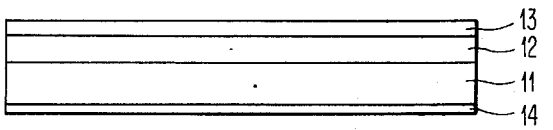

FIG. 4 shows the cross section of the wafer after completion of the gettering step with the low resistance layer 14.

While the method of gettering is standard, the application of gettering in this invention is different from conventional usage. The conventional application of gettering is after the formation of the PN junction, whereas in this invention the gettering is performed prior to the junction formation. This difference in sequence is necessary for the successful fabrication of very low voltage Zener diodes. If the gettering step is performed after the junction formation, as is conventionally done, additional processing steps are required to protect the junction from the heavy concentration of phosphorus. Furthermore, due to the additional high temperature treatment, a higher Zener voltage will result.

Figure 5:
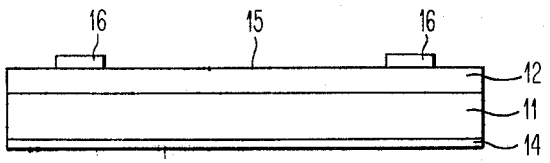

5. Etching of Oxide: Standard photolithographic and etching techniques are used to selectively etch oxide on the front side of the wafer. FIG. 5 shows a cross section of the wafer with an oxidized ring 16 surrounding an open window 15 which exposes the surface of the epitaxial layer 12. The window opening can be of any reasonable size; typically, for a 20 mil square die, the window diameter is in the range of 1–13 mils. The width of the oxide ring 16 should be in the range of 1–2 mils for optimum subsequent epitaxial growth.

Selective epitaxial deposition through an oxide mask is the preferred method of producing low voltage Zener diodes according to the present invention for reasons of simplicity, cost and ease of passivation. It will be understood, however, that the epitaxial layer can be deposited non-selectively and thereafter etched to achieve the localized area.

Figure 6:
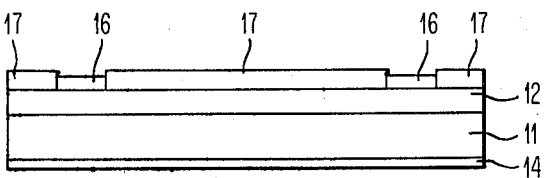

6. Preferential Epitaxial Growth: A heavily doped P or N-type silicon layer is grown on the exposed surface of the N or P-type wafer by selective epitaxial deposition through the window 15. FIG. 6 shows a cross section of the wafer with the preferential epi growth 17. This growth is the crucial step in which a PN junction with a very low breakdown voltage is formed.

In order to obtain the abrupt junction which is necessary for low Zener voltages, it is important to deposit heavily doped silicon on the exposed surface by epitaxial growth in the presence of a dopant at a somewhat lower temperature than the temperature at which the exposed surface is cleaned by etching. If the epitaxial growth temperature is too high, the diffusion of dopants across the junction will be greater, deleteriously affecting the abruptness of the junction. If the epitaxial growth temperature is made too low, polysilicon (silicon formed of microdimensional crystals) will result.

More particularly, the following procedures are recommended for the preferential epitaxial growth in the fabrication of Zener diodes with breakdown voltages down to 2.4 V: The wafers are first etched in a gas phase epitaxial reactor using 0.1 to 1% of hydrogen chloride (HCl) gas in a hydrogen ($H_2$) gas carrier. The reactor temperature is preferably in a range of 1100°–1150° C. to insure good etching results. Etching is carried out for a period of 0.5 to 2 minutes, and preferably for about 1 minute. Thereafter, the reactor temperature is changed to a second temperature in the range of 980° to 1000° C., depending upon the Zener voltage desired. When this second, lower temperature is reached, a gas phase silicon source and a dopant are introduced into the reactor for 9–12 minutes and the hydrogen chloride concentration is reduced to 0.1 to 0.3%. The silicon source is silane ($SiH_4$) and has a concentration in the range of 0.04 to 0.06%. The actual percentage will depend upon the reactor design. As a dopant, diborane ($B_2H_6$) is used to produce a P-type epi layer or arsene ($AsH_3$) is used to produce an N-type epi layer. The dopant is introduced into the reactor together with the silicon source with a concentration of 0.00005 to 0.0002%. As noted above, 0.1 to 0.3% of hydrogen chloride is also introduced into the reactor to control the growth of silicon on the insulating layer. The carrier gas employed throughout this etching and deposition process is hydrogen.

As an example, at a reactor temperature of 1125° C., N-type wafers are etched in 0.5% of hydrogen chloride in hydrogen carrier gas for one minute. The reactor temperature is then lowered to 990° C., at which temperature 0.05% of silane, 0.125% of hydrogen chloride and 0.0001% of diborane are introduced into the reactor for 11 minutes. The chemical reaction results in a heavily doped P-type epitaxial layer 1.5–3.0 μm in thickness.

The data given above is summarized in the following table:

TABLE II

| | TIME | TEMPERATURE | MATERIAL | CONCENTRATION | |
|---|---|---|---|---|---|
| ETCH | 1 min | 1125° C. | HCL | 0.5% | Nom. |
| | 0.5–2.0 min | 1100–1150° C. | | 0.1–1.0% | Range |
| | | | $H_2$ | 99.5% | Nom. |
| | | | | 99.0–99.9% | Range |
| DEPO- | 11 min | 990° C. | $SiH_4$ | 0.5% | Nom. |
| SITTON | 9–12 min | 980–1000° C. | | 0.4–0.6% | Range |
| | | | | 0.0001% | Nom. |
| | | | $B_2H_6$ OR | 0.001% | Nom. |
| | | | $AsH_3$ | 0.00005–0.0002% | Range |
| | | | HCL | 0.125% | Nom. |
| | | | | 0.1–0.3% | Range |

TABLE II-continued

| TIME | TEMPERATURE | MATERIAL | CONCENTRATION | |
|---|---|---|---|---|
| | | H$_2$ | 99.8249% | Nom. |
| | | | 99.6398–99.85995% | Range |

7. Passivation: A frit glass, silicon nitride (Si$_3$N$_4$) or any suitable passivation material that will protect the device from ionic contamination is deposited on top of the wafer by any method that will satisfactorily result in a passivating layer of suitable thickness providing that the deposition temperature or firing temperature does not exceed 900° C. for more than ten hours. After the deposition of the passivating material, a window is opened for subsequent metallic contact for electrical conduction. Any appropriate photolithographic and etching techniques may be used to open the window.

Figure 7:
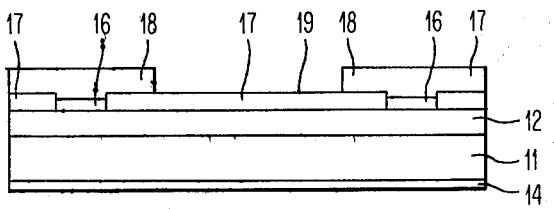

FIG. 7 shows a cross section of the wafer with the passivation material 18 deposited thereon. A window 19 has been opened to the epitaxial layer 17.

8. Metallization, Dicing and Packaging: Any appropriate metallization system that provides good physical adhesion to the silicon surface and good electrical conduction can be used for electrical contact, providing that it is compatible with the package. A typical and preferred system is palladium silicide on the front window area, onto which a thick layer of silver, typically 1-3 mils thick, is deposited by a standard electroplating method.

Figure 8:
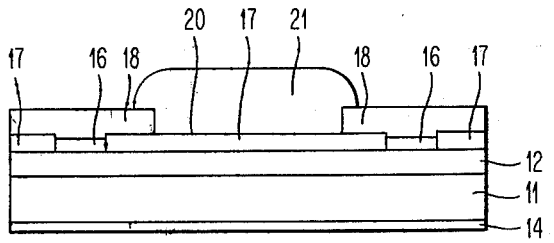

FIG. 8 shows a cross section of the wafer with a layer of palladium silicide 20 deposited on the epitaxial layer and a thick layer of silver 21 deposited on the palladium silicide. A layer of metallization 22 is also deposited on the backside of the wafer.

The backside metallization may consist of, but is not limited to the following combinations of metals:
(a) chromium followed by silver;
(b) chromium followed by silver followed by gold;
(c) titanium followed by silver;
(d) gold followed by silver;
(e) nickel followed by gold.

After appropriate centering procedures, the wafers are diced and packaged.

Figure 9:
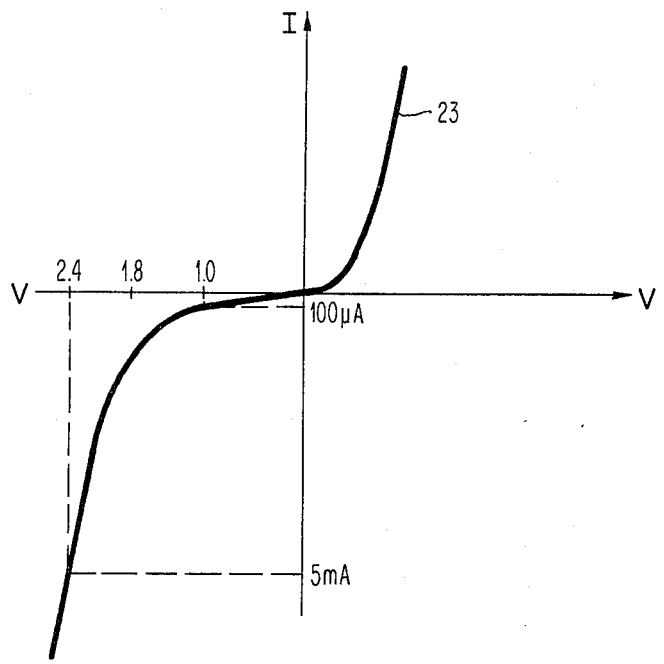
FIG. 9 illustrates a typical characteristic curve of a Zener diode according to the present invention.

9. Control of Zener Voltage: A typical characteristic curve of a very low voltage Zener diode is shown in FIG. 9. In this diagram, the curve 23 falls abruptly in the lower left quadrant, reaching a 5 mA at 2.4 V. I have discovered that a Zener diode having this characteristic may be produced using the epitaxial deposition methods disclosed herein provided that certain conditions are maintained. Of primary importance are type and concentrations of the deposition materials and the temperature at which the epitaxial growth is carried out. As indicated above, lower reactor temperatures must be used during epitaxial deposition than during etching in order to create an abrupt PN junction.

Figure 10:
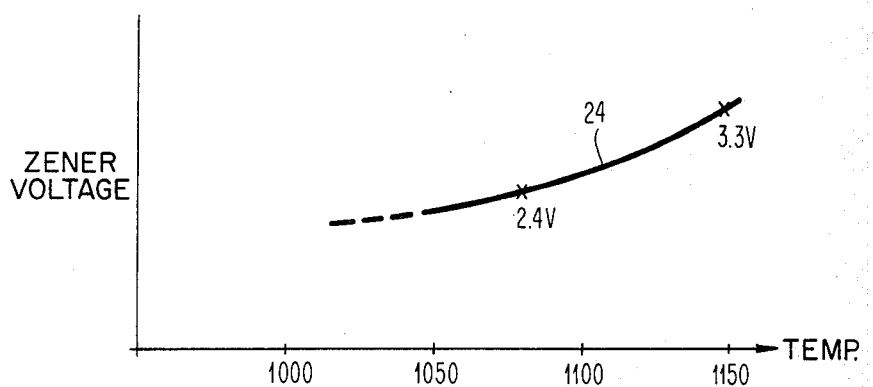
FIG. 10 is a graph illustrating the dependency of Zener voltage on the temperature of epitaxial deposition.

FIG. 10 shows a band of Zener voltages as they are related to the reactor temperature during deposition, assuming a substrate resistivity of 0.0045 Ω-cm. At 1025° C. a 3.3 V ±0.1 V Zener diode will result. As the reactor temperature is lowered, the Zener voltage will correspondingly drop within the range bounded by the curves 24 and 25. At 990° C., the Zener voltage will be 2.4 V±0.1 V. The temperature may be lowered to approximately 980° C., but below this temperature the results become less and less reproducable. This is due to the fact that at lower temperatures polysilicon will be grown instead of a single crystal. This results in poor electrical characteristics; for example, reverse leakage current at 1 V will be greater than 100 μA.

While the methods described herein of making Zener diodes, and the Zener diodes made according to these methods constitute preferred embodiments of the invention. it will be understood that the invention is not limited to these embodiments, and that a variety of changes may be made thereto without departing from the spirit and scope of the invention.

I claim:

1. A method of making a Zener diode having a Zener voltage in a range of 2.4 to 3.3 volts, said method comprising the steps of:
    (a) providing a silicon wafer of one conductivity type having an exposed surface, said wafer having a resistivity at its surface in the range of 0.003 to 0.006 Ω-cm; and
    (b) growing a heavily-doped silicon layer of opposite conductivity type on said exposed surface by epitaxial deposition, said growing step comprising the steps of:
        (1) etching said exposed surface at a first temperature above 1100° C. to clean said surface; and
        (2) depositing heavily doped silicon on said exposed surface by epitaxial growth in a gas phase epitaxial reactor using silane (SiH$_4$) as a silicon source in the presence of a gaseous dopant, said epitaxial growth being effected at a second temperature in the range of 975°–1025° C. depending upon the Zener voltage desired, the heavily doped silicon layer so formed having a resistivity in the range of 0.001–0.003 Ω-cm.

2. The method defined in claim 1, wherein said wafer has a uniform resistivity throughout.

3. The method defined in claim 1, wherein said wafer comprises a silicon epitaxial layer of said one conductivity type having a resistivity in the range of 0.003–0.006 Ω-cm on a low resistivity substrate of the same conductivity type.

4. The method defined in any one of claims 1–3, wherein said one conductivity type is N-type and said opposite conductivity type is P-type.

5. The method defined in claim 3, wherein said silicon epitaxial layer has a thickness in the range of 5–20 μm.

6. The method defined in claim 1, further comprising the step, prior to deposition, of forming an insulating layer on the surface of said wafer having a window therein exposing said surface; wherein said heavily-doped silicon layer is grown on said exposed surface by selective epitaxial deposition through said window.

7. The method defined in claim 6, wherein said insulating layer is an oxide.

8. The method defined in claim 6, wherein said insulating layer has a thickness in the range of 0.5–1.5 μm.

9. The method defined in claim 6, wherein said insulating layer forms a ring with a width of 1–2 mils and an inner window diameter of 1–13 mils.

10. The method defined in claim 1, wherein said heavily-doped layer has such a thickness that the PN junction formed at the base of said heavily-doped layer is neither physically nor electrically affected by a conductor electrode which is subsequently deposited on said heavily-doped layer.

11. The method defined in claim 10, wherein said heavily-doped layer has a thickness in the range of 1.5–3.0 μm.

12. The method defined in claim 1, wherein said first temperature is in the range of 1100°–1150° C.

13. The method defined in claim 12, wherein said first temperature is approximately 1125° C.

14. The method defined in claim 12, wherein said first temperature is maintained for a period of 0.5–2.0 minutes.

15. The method defined in claim 14, wherein said first temperature is maintained for approximately 1.0 minute.

16. The method defined in claim 12, wherein step (b) (1) includes etching said exposed surface with 0.1–1% of hydrogen chloride in a carrier gas.

17. The method defined in claim 16, wherein step (b) (1) includes etching said exposed surface with approximately 0.5% hydrogen chloride in a carrier gas.

18. The method defined in claim 16, wherein said carrier gas is hydrogen.

19. The method defined in claim 1, wherein said second temperature is in the range of 980°–1000° C., thereby to provide a Zener voltage of approximately 2.4 volts.

20. The method defined in claim 19, wherein said second temperature is approximately 990° C.

21. The method defined in claim 19, wherein said second temperature is maintained for a period of 9–12 minutes.

22. The method defined in claim 21, wherein said second temperature is maintained for a period of approximately 11 minutes.

23. The method defined in claim 1, wherein said silane has a concentration in the range of 0.04–0.06%.

24. The method defined in claim 23, wherein said silane has a concentration of approximately 0.05%.

25. The method defined in claim 1, wherein said dopant is selected from the group consisting of borane and arsene.

26. The method defined in claim 25, wherein said dopant has a concentration in the range of 0.00005–0.0002%.

27. The method defined in claim 26, wherein said dopant has a concentration of approximately 0.0001%.

28. The method defined in claim 1, wherein hydrogen chloride is also introduced into said epitaxial reactor during step (b) (2) to control the growth of silicon on said insulating layer.

29. The method defined in claim 28, wherein said hydrogen chloride has a concentration in the range of 0.1–0.3%.

30. The method defined in claim 29, wherein said hydrogen chloride has a concentration of approximately 0.125%.

31. The method defined in claim 1, wherein hydrogen gas is also present in said epitaxial reactor as a carrier.

32. The method defined in claim 6, further comprising the step of gettering said wafer with said insulating layer prior to formation of a PN junction thereon.

33. The method defined in claim 32, wherein said gettering step inclues doping said wafer with phosphorus.

34. The method defined in claim 6, further comprising the step of depositing a layer of passivation material on said insulating and said heavily-doped layer at a temperature not in excess of 900° C.

35. The method defined in claim 22, wherein said passivation material is a frit glass.

36. The method defined in claim 34, wherein said passivation material is a silicon nitride.

37. The method defined in claim 34, further comprising the step of opening a window through said passivation material to said heavily-doped layer and depositing metallization onto said heavily-doped layer through said window to provide an electrical contact.

38. The method defined in claim 37, wherein said metallization is palladium silicide followed by silver.

39. The method defined in claim 37 further comprising the step of depositing a second metallization on the back side of said wafer.

40. The method defined in claim 37, wherein said second metallization is chromium followed by silver.

* * * * *